(12) United States Patent
Chen et al.

(10) Patent No.: US 6,551,946 B1
(45) Date of Patent: Apr. 22, 2003

(54) TWO-STEP OXIDATION PROCESS FOR OXIDIZING A SILICON SUBSTRATE WHEREIN THE FIRST STEP IS CARRIED OUT AT A TEMPERATURE BELOW THE VISCOELASTIC TEMPERATURE OF SILICON DIOXIDE AND THE SECOND STEP IS CARRIED OUT AT A TEMPERATURE ABOVE THE VISCOELASTIC TEMPERATURE

(75) Inventors: Yuanning Chen, Orlando, FL (US); Sundar Srinivasan Chetlur, Orlando, FL (US); Pradip Kumar Roy, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/597,076

(22) Filed: Jun. 20, 2000

Related U.S. Application Data

(60) Provisional application No. 60/140,666, filed on Jun. 24, 1999.

(51) Int. Cl.$^7$ ............................ H01L 21/31; H01L 21/469
(52) U.S. Cl. ............................................ 438/770; 438/591
(58) Field of Search ......................... 438/591, 765, 438/770, 787, 774, 773

(56) References Cited

U.S. PATENT DOCUMENTS

| | | | |
|---|---|---|---|
| 4,277,320 A | | 7/1981 | Beguwala et al. |
| 4,518,630 A | * | 5/1985 | Grasser ................. 257/410 |
| 4,826,779 A | * | 5/1989 | Wright et al. ........... 438/251 |

(List continued on next page.)

FOREIGN PATENT DOCUMENTS

| | | | |
|---|---|---|---|
| EP | 0 301 460 | 2/1989 | |
| EP | 0 323 071 | 7/1989 | |
| EP | GB 2 347 265 A | 1/2000 | ......... H01L/21/316 |

(List continued on next page.)

OTHER PUBLICATIONS

Ghandi VLSI Fabrication Principles, 2nd ed. John Wiley & Sons: New York, 1994, p. 453.*

Wolf, et al. Silicon Processing for the VLSI Era, vol. 1–Process Technology, Lattice Press: Sunset Beach CA, 1986, p. 5.*

(List continued on next page.)

*Primary Examiner*—Carl Whitehead, Jr.
*Assistant Examiner*—Erik Kielin

(57) ABSTRACT

A process for forming an oxide layer includes forming a first oxide portion over a substrate at a temperature below a threshold temperature. A second oxide portion is formed under the first oxide portion at a temperature above the threshold temperature. The substrate is illustratively oxidizable silicon and the threshold temperature is the viscoelastic temperature of silicon dioxide.

10 Claims, 9 Drawing Sheets

U.S. PATENT DOCUMENTS

| | | |
|---|---|---|
| 4,851,370 A | 7/1989 | Doklan et al. |
| 5,016,081 A | 5/1991 | Brown et al. |
| 5,077,691 A | 12/1991 | Haddad et al. |
| 5,089,441 A | 2/1992 | Moslehi |
| 5,153,701 A | 10/1992 | Roy |
| 5,334,556 A | 8/1994 | Guldi |
| 5,371,394 A | 12/1994 | Ma et al. |
| 5,464,783 A | 11/1995 | Kim et al. |
| 5,514,608 A | 5/1996 | Williams et al. |
| 5,567,638 A | 10/1996 | Lin et al. |
| 5,598,369 A | 1/1997 | Chen et al. |
| 5,619,052 A | 4/1997 | Chang et al. |
| 5,622,607 A | 4/1997 | Yamazaki et al. |
| 5,629,221 A | 5/1997 | Chao et al. |
| 5,707,888 A | 1/1998 | Aronowitz et al. |
| 5,739,580 A | 4/1998 | Aronowitz et al. |
| 5,757,204 A | 5/1998 | Nayak et al. |
| 5,814,562 A | 9/1998 | Green et al. |
| 5,817,581 A * | 10/1998 | Bayer et al. ................. 438/770 |
| 5,821,158 A | 10/1998 | Shishiguchi |
| 5,851,892 A | 12/1998 | Lojek et al. ................. 438/305 |
| 5,863,831 A | 1/1999 | Ling et al. |
| 5,867,425 A | 2/1999 | Wong |
| 5,869,405 A | 2/1999 | Gonzalez et al. |
| 5,877,057 A | 3/1999 | Gardner et al. |
| 5,885,870 A | 3/1999 | Maiti et al. |
| 5,891,809 A | 4/1999 | Chau et al. |
| 5,913,149 A | 6/1999 | Thakur et al. |
| 5,918,137 A | 6/1999 | Ng et al. |
| 5,926,741 A | 7/1999 | Matsuoka et al. |
| 5,968,279 A | 10/1999 | MacLeish et al. |
| 5,972,804 A | 10/1999 | Tobin et al. |
| 6,008,128 A | 12/1999 | Habuka et al. |
| 6,020,247 A | 2/2000 | Wilk et al. |
| 6,025,280 A | 2/2000 | Brady et al. |
| 6,027,975 A | 2/2000 | Hergenrother et al. |
| 6,029,680 A | 2/2000 | Hawthorne et al. |
| 6,069,062 A | 5/2000 | Downey |
| 6,083,815 A | 7/2000 | Tsai et al. |
| 6,083,836 A | 7/2000 | Rodder |
| 6,180,454 B1 | 1/2001 | Chang et al. |
| 6,197,641 B1 | 3/2001 | Hergenrother et al. |
| 6,207,591 B1 * | 3/2001 | Aoki et al. ................. 432/94 |
| 6,210,999 B1 | 4/2001 | Gardner et al. |
| 6,222,233 B1 | 4/2001 | D'Anna |
| 6,281,140 B1 | 8/2001 | Chen et al. |
| 6,281,559 B1 | 8/2001 | Yu et al. |
| 6,316,300 B1 * | 11/2001 | Ozeki et al. ................. 438/197 |

FOREIGN PATENT DOCUMENTS

| | | | |
|---|---|---|---|
| GB | 2 056 174 | 3/1981 | |
| JP | 62 079 628 | 4/1987 | |
| JP | 1-204435 | 8/1989 | |
| WO | WO 96/33510 | 4/1995 | ......... H01L/21/316 |

OTHER PUBLICATIONS

U.S. patent application Ser. No. 09/597,077, Chen et al., filed Jun. 20, 2000.

U.S. patent application Ser. No. 09/481,992, Chen et al., filed Jan. 11, 2000.

European Standard Search Report –Dated: Feb. 9, 2001.

Ponomarev et al.; High–Performance Deep SubMicron CMOS Technologies with Polycrystalline–SiGe Gates; IEEE Transactions on Electron Devices, vol. 47, No. 4, Apr. 2000; pp. 848–855.

Lee et al.; Enhancement of PMOS Device Performance with Poly–SiGe Gate; IEEE Electron Device Letters, vol. 20, No. 5, May 1999; pp. 232–234.

Song et al.; Ultra Thin (<20) CVD Si3N4 Gate Dielectric for Song et al.; Ultra Thin (<20) CVD Si3N4 Gate Dielectric for Deep–Sub–Micron CMOS Devices; Microelectronics Research Center, The University of Texas, Austin; 4 pages.

Hattangady et al.; Ultrathin nitrogen–profile engineered gate dielectric films; Semiconductor Process and Device Center, Texas Instruments; 4 pages.

Tseng et al.; Reduced Gate Leakage Current and Boron Penetration of 0.18 m 1.5 V MOSFETs Using Integrated RTCVD Oxynitride Gate Dielectric; 4 pages.

Hattangady et al.; Remote Plasma Nitrided Oxides for Ultrathin Gate Dielectric Applications; SPIE 1998 Symp. Microelec. Manf.; Sep. 1998; Santa Clara, CA; pp. 1–11.

Wu et al.; Improvement of Gate Dielectric Reliability for p+Poly MOS Devices Using Remote PECVD Top Nitride Deposition on Thin Gate Oxides; IEEE 98 36th Annual International Reliability Physics Symposium; Reno,Nevada; 1998; pp. 70–75.

Chatterjee et al.; Sub–100nm Gate Length Metal Gate NMOS Transistors Fabricated by a Replacement Gate Process; Semiconductor Process and Device Center, Texas Instruments; 1997 IEEE; 4 pages.

Kraft et al.; Surface nitridation of silicon dioxide with a high density nitrogen plasma; J. Vac. Scl. Technol. B, vol. 15, No. 4; 1997 American Vacuum Society; Jul./Aug. 1997; pp. 967–970.

Jeon et al.; Low Temperature Preparaton of SiO2 Films with Low Interface Trap Density Using ECR Diffusion and ECR CVD Methods; 1996 Conference on Optoelectronic and Microelectronic Materials and Devices Proceedings, Canberra, ACT, Australia, 8–11 Dec. 1996; pp. 259–262.

Rau et al.; Characterization of stacked gate oxides by electron holography; Appl. Phys. Lett., vol. 68, No. 24; 1996 American Institute of Physics; Jun. 10, 1996, pp. 3410–3412.

Cramer et al.; Sodium passivation dependence on phosphorus concentration in tetraethylorthosilicate plasma–enhanced chemical vapor deposited phosphosilicate glasses; J. Appli. Phys. vol. 73, No. 5; 1993 American Institute of Physics; Mar. 1, 1993; pp. 2458–2461.

Wolf; Silicon Processing For The VLSI Era; vol. 2: Process Integration; Lattice Press, Sunset Beach, California; 1990; pp. 354–361.

* cited by examiner

TWO-STEP OXIDATION PROCESS FOR OXIDIZING A SILICON SUBSTRATE WHEREIN THE FIRST STEP IS CARRIED OUT AT A TEMPERATURE BELOW THE VISCOELASTIC TEMPERATURE OF SILICON DIOXIDE AND THE SECOND STEP IS CARRIED OUT AT A TEMPERATURE ABOVE THE VISCOELASTIC TEMPERATURE

CROSS-REFERENCE TO RELATED APPLICATION

This present application claims priority from Provisional Application Serial No. 60/140,666 (filed Jun. 24, 1999).

FIELD OF THE INVENTION

This present application relates to integrated circuit fabrication and particularly to a technique for fabricating a high quality, planar and substantially stress-free oxide.

BACKGROUND OF THE INVENTION

As integrated circuit (IC) complexity increases, the size of devices within the IC must decrease. To decrease the size of a device, the various elements of a device must be reduced proportionately. This is known as device scaling. In one type of device, a metal-oxide-semiconductor (MOS) structure, device scaling requires that the oxide layer be made thinner. Unfortunately, as conventional oxides are made thinner (scaled), their quality tends to degrade. The degradation in oxide quality tends to adversely impact the reliability of a device using the oxide.

In addition to oxide quality, the reliability of the dielectric material in a MOS structure may be affected by oxide stress and the planarity of the oxide-substrate interface. Oxide stress can result from lattice mismatch and growth induced stress. Lattice mismatch is difficult to overcome and growth stress has been addressed in a variety of ways with mixed results. Stress in the oxide may lead to dislocations and defects especially in the interfacial region. This may result in mass transport paths and leakage current.

The reliability of a device is characterized by a few conventional criteria. For example, in a MOS transistor reliability may be characterized in terms of the change in conventional device parameters over time (known as device parameter drift). Additionally, time-dependent dielectric breakdown (TDDB) may be used to characterize reliability of the transistor.

Under operating bias (applied voltage) and temperature conditions, device parameters such as threshold voltage ($V_t$), saturation current ($I_{DSAT}$) and transconductance ($g_m$) tend to drift to unacceptable values. In fact, the drift in device parameters during normal operation is thought to be more problematic than other known reliability problems, such as dielectric breakdown of the oxide. Accordingly, in some cases, device parameter drift can cause a device to fail well before dielectric breakdown occurs.

In order to address the reliability issues discussed above, a variety of approaches have been tried. For example, it is known that the best oxides for many IC devices are grown rather than deposited oxides. Furthermore, the higher growth temperatures may yield a better quality oxide. Unfortunately, there are problems associated with fabricating oxides at high temperatures by conventional techniques. For example, in achieving the high temperatures required in the high temperature oxide growth sequence, the overall thickness of the oxide grown tends to increase. As a result the oxide may be too thick for a reduced dimension device. Thus, in the effort to fabricate a better equality oxide, device scaling objectives may be defeated. Moreover, when cooling down from the high growth temperatures, the viscosity of the grown oxide increases and growth induced stress may result. Given these issues, it is customary in the semiconductor industry to grow oxides at low temperatures. The drawback to this practice is that by growing oxide at lower temperatures, the oxide quality may be compromised. This reduction in quality adversely impacts reliability of the oxide for reasons discussed above.

What is needed, therefore, is a process for fabricating ultra-thin oxides which overcomes the problems described above.

SUMMARY OF THE INVENTION

The present invention relates to a process for fabricating an oxide. A first oxide portion is formed over a substrate at a first temperature below a threshold temperature. A second oxide portion is formed under the first oxide portion at a temperature above the threshold temperature. In an illustrative embodiment, the substrate is oxidizable silicon and the threshold temperature is the viscoelastic temperature of silicon dioxide. The resulting oxide has a low defect density ($D_0$), a low interface trap density ($N_{it}$) and the oxide/substrate interface is planar and substantially stress-free.

BRIEF DESCRIPTION OF THE DRAWING

The invention is best understood from the following detailed description when read with the accompanying drawing figures. It is emphasized that in accordance with standard practice in the semiconductor industry the various features are not necessarily drawn to scale. In fact, the dimensions of the various features may be arbitrarily increased or decreased for clarity of discussion.

DETAILED DESCRIPTION

Figure 2A:
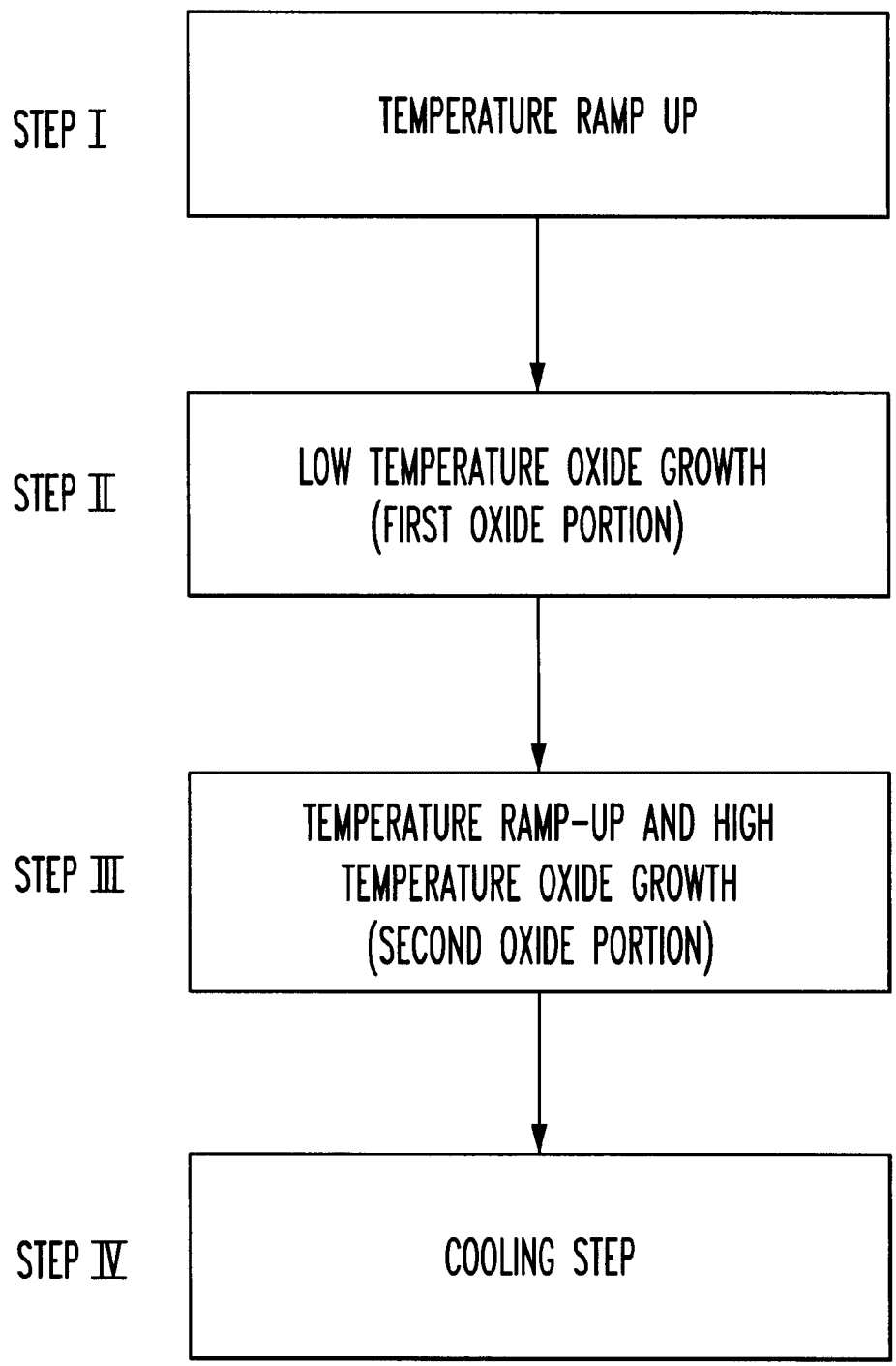
FIG. 2a is a flow chart of an exemplary fabrication sequence in accordance with the present invention.

The present invention will now be described more fully with reference to the accompanying drawing figures, in which exemplary embodiments of the present invention are shown. Referring initially to FIG. 2a, an exemplary sequence for fabricating an oxide layer according to the present invention is shown. Step I includes a relatively rapid temperature increase followed by a more gradual temperature increase. Step I occurs in a dilute oxygen ambient so that very little oxide is grown in this step. Section II includes a low temperature oxide growth step. This results in the formation of a first oxide portion over a substrate at a temperature below a threshold temperature. Step III includes a temperature increase, illustratively in two stages, to a temperature above the threshold temperature. The two stage temperature increase is believed to reduce growth induced stress in the oxide. This two stage temperature increase is followed by a high temperature oxide growth at a temperature above the threshold temperature. This results in the formation of a second oxide portion below the first oxide portion. An illustrative cooling step is carried out in step IV. This step includes a gradual decrease in the temperature to below the threshold temperature, followed by a more rapid temperature decrease. In this cooling phase, the first oxide portion is believed to act as a sink for stress relaxation.

A characteristic of the present invention is that the interface between the second oxide portion and the substrate is substantially planar. This planarity is generally measured in terms of surface roughness. In the oxide of the present invention the interface has a surface roughness of approximately 0.3 nm or less. Moreover, the interface between the substrate and the second oxide portion is substantially stress-free, having on the order of 0 to $2 \times 10^9$ dynes/cm$^2$ of compression. This results in a defect density ($D_0$) on the order of 0.1 defects/cm$^2$ or less. Finally, the second oxide portion is believed to be a more dense layer of oxide, when compared to conventional oxides. As a result of the dense and substantially stress free characteristics of the oxide, the interface trap density ($N_{it}$) of the oxide of the present invention is on the order of $5 \times 10^{10}$/cm$^2$ to $3 \times 10^9$/cm$^2$ or less.

The resultant ultra-thin oxide having improved planarity, being substantially stress free and being more dense has clear advantages over conventional oxides. These advantages include improvements in both reliability and performance in devices incorporating the oxide of the present invention. To this end, deleterious effects of device parameter drift, and time dependent dielectric breakdown (TDDB) are reduced by virtue of the present invention. Moreover, device performance may be improved through reduced leakage current and increased mobility, for example. These characteristics of the oxide of the present invention and the improvements in reliability and performance are discussed more fully herein.

Figure 1A:
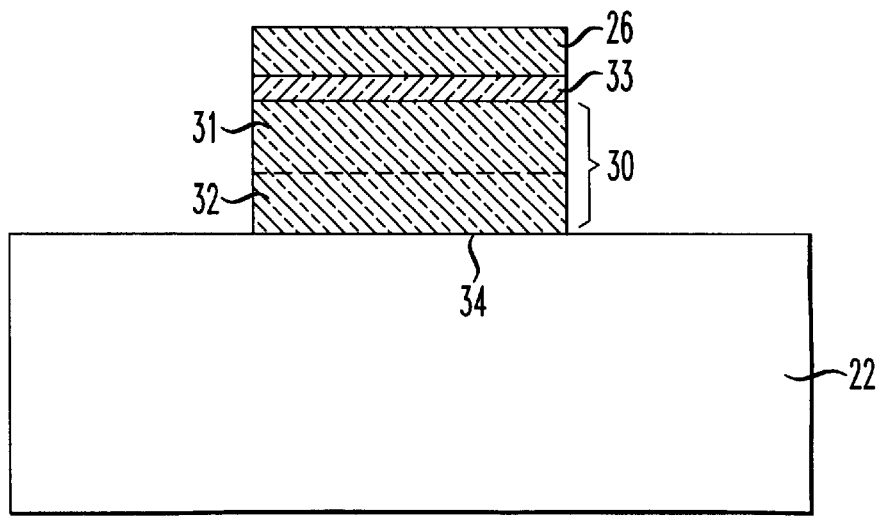
FIG. 1a is a schematic cross-sectional view of an exemplary MOS structure according to the present invention.

Referring to FIG. 1a, an oxide layer 30 in accordance with an exemplary embodiment of the present invention is first described. Illustratively, the oxide layer 30 is incorporated into an integrated circuit. The oxide layer 30 is disposed over a substrate 22, and includes a first oxide portion 31 and a second oxide portion 32. The second oxide portion 32 forms an interface 34 with the substrate 22. The substrate 22 is illustratively silicon; it may be monocrystalline or polycrystalline silicon. Most generally it is oxidizable silicon. Illustratively, the oxide layer 30 has a thickness of approximately 40 Å or less. It is anticipated that the thickness of the oxide layer 30 may be 15 Å–20 Å; and may be even less than 15 Å. Moreover, the oxide layer may have a layer of material 33 disposed between it and a conductive layer 26. Layer 33 may be a high-k material, including but not limited to tantalum pentoxide, barium-strontium titanate, and silicate dielectric materials. Additionally, other materials may be disposed between the conductive layer 26 and the oxide layer 30 to achieve a variety of results as would be appreciated by the artisan of ordinary skill.

The exemplary embodiment of FIG. 1a is generally a MOS structure. Clearly a variety of devices and elements may incorporate this structure. These include, but are not limited to a MOS transistor (described below) and a MOS capacitor, a common element in integrated circuits. Still other devices and elements may incorporate the oxide of the present invention, as would be readily apparent to one having ordinary skill in the art to which the present invention relates.

Figure 1B:
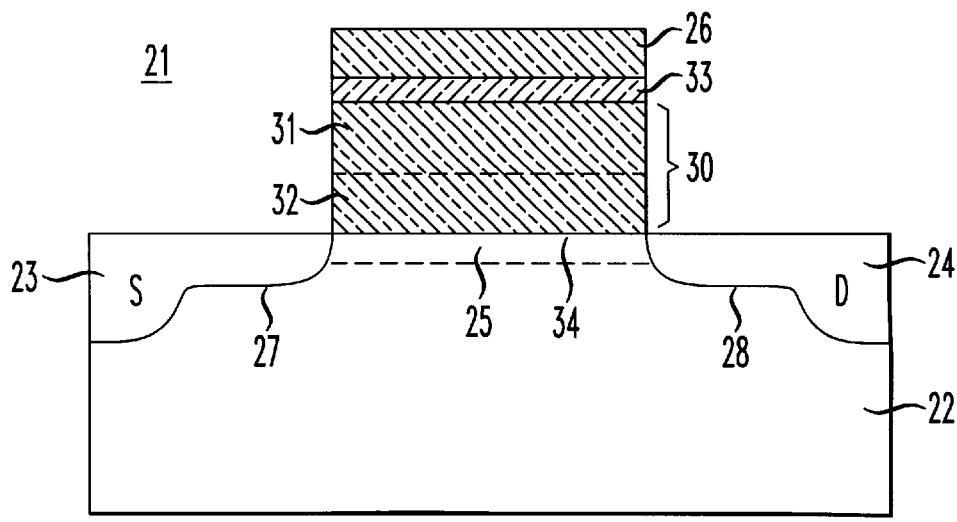
FIG. 1b is schematic cross sectional view of an exemplary MOS transistor according to the present invention.

In the exemplary embodiment shown in FIG. 1b, the oxide layer 30 is incorporated into a MOS transistor 21. The MOS transistor includes a source 23 and a drain 24, separated by a channel 25. The transistor may also include lightly doped source and drain regions 27 and 28, respectively. The source, drain and channel may be fabricated by a variety of conventional techniques to form a variety of transistor structures including but not limited to PMOS, NMOS complementary MOS (CMOS) and laterally diffused MOS (LDMOS) devices.

Figure 2B:
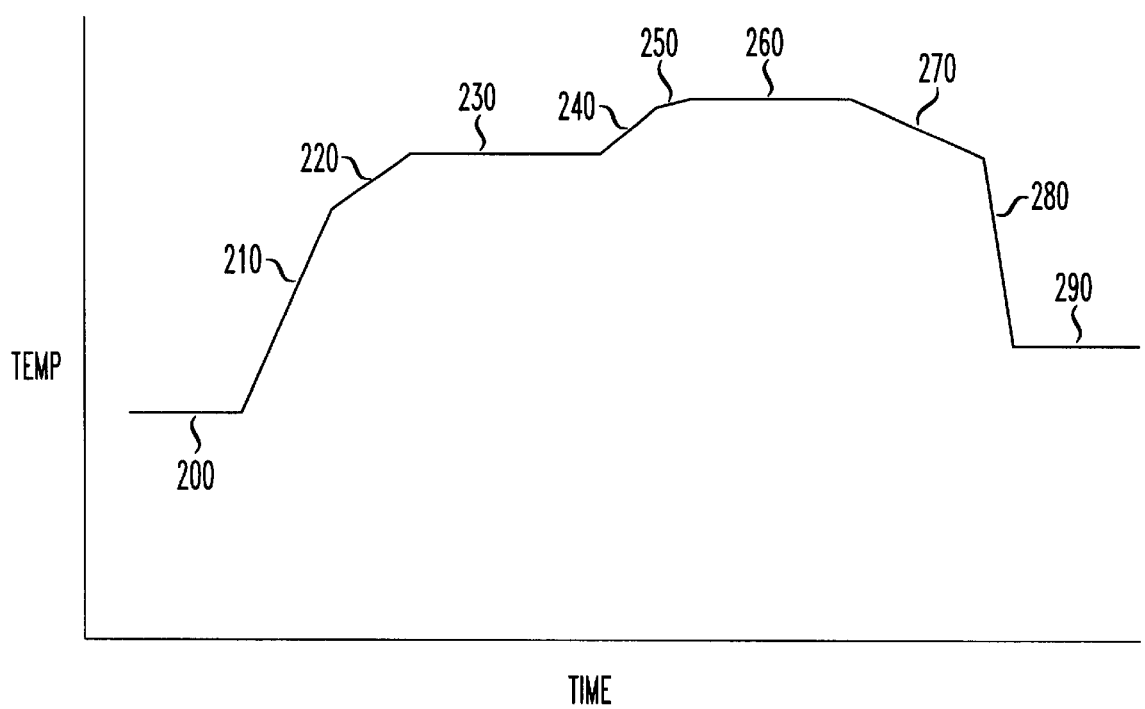
FIG. 2b is a graph of temperature vs. time in accordance with an exemplary fabrication sequence of the present invention.
Figure 3:
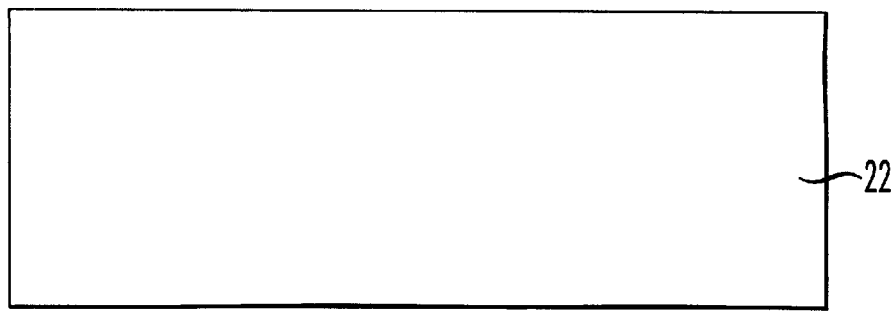
FIGS. 3–5 are schematic cross sectional views illustrating the processing sequence of forming the oxide layer in accordance with an exemplary embodiment of the present invention.
Figure 4:
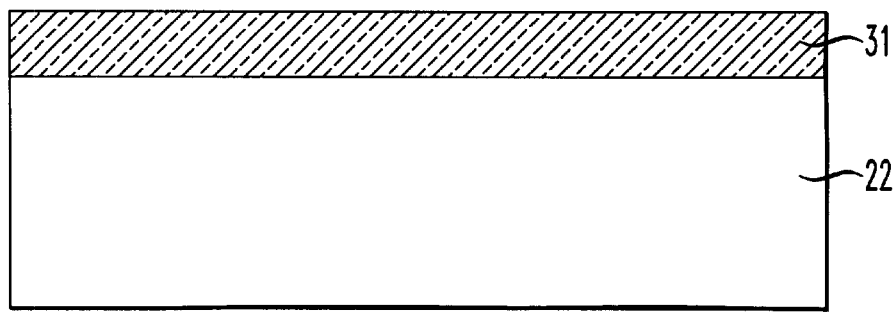
Figure 5:
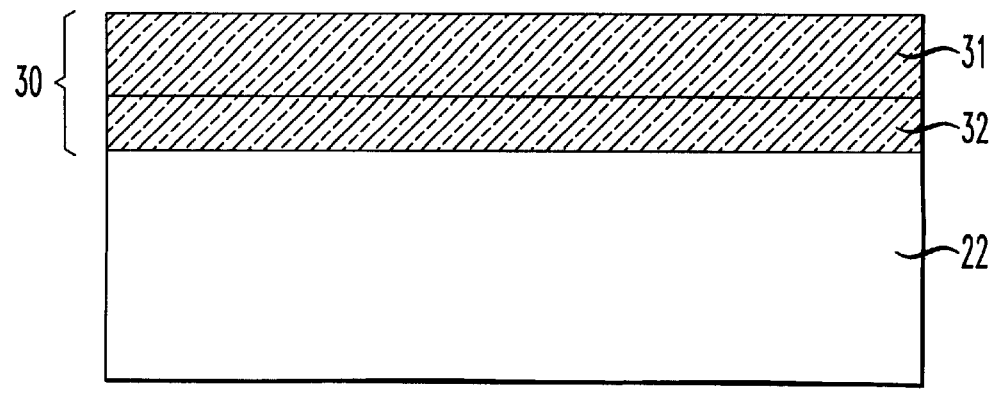

Turning to FIG. 2b, an illustrative sequence for fabricating the oxide layer 30 by fast thermal processing (FTP) is shown. (Cross sectional views of this exemplary growth sequence and the resulting oxide structure are shown in FIGS. 3–5). Segment 200 indicates a wafer boat push step at an initial temperature of approximately 300° C.–700° C., with nitrogen flow of 8.0 L/min and 0.02 to 1% ambient oxygen concentration. These parameters are chosen to minimize the growth of native oxide, which can degrade oxide quality as well as consume the allowed oxide thickness determined by scaling parameters (referred to as oxide thickness budget or scaling budget). Additionally, a load lock system or a hydrogen bake, well known to one of ordinary skill in the art, can be used to impede the growth of this undesirable low-temperature oxide.

Segment 210 is a rapid upward temperature increase at approximately 50–125° C. per minute to about 750° C.–850° C. This step is carried out at a very low oxygen ambient concentration (on the order of 0.05% to 5%) and a high nitrogen ambient. One aspect of the present embodiment relates to the step of upwardly ramping the temperature at a relatively high rate (segment 210) to minimize the thickness of the oxide formed in this segment (known as the ramp oxide). This helps control the overall thickness of the oxide 30. Thus, through this step, the desired higher growth temperatures (segments 230 and 260) may be attained without sacrificing the oxide thickness budget. Moreover, this rapid rise in temperature at low ambient oxygen concentrations retards the growth of lower temperature oxide, which may be of inferior quality, as discussed above.

Segment 220 is a more gradual increase in temperature. Segment 220 proceeds at approximately 10–25° C. per minute. In the exemplary embodiment the temperature reached at the end of segment 220 is in the range of approximately 800° C. to 900° C. The same oxygen and nitrogen flows/concentrations used in segment 210 are maintained in segment 220. This control of the ramp up in temperature in segment 220 is also important as it helps to prevent overshooting the growth temperature of segment 230. Finally, the low concentration of oxygen in segment 220 selectively retards the growth of oxide during the temperature increase to a higher growth temperature. Again this helps to preserve the oxide thickness budget.

Segment 230 is a low temperature oxide (LTO) growth step. In this step, the ambient oxygen concentration is about 0.1% to about 10% while the ambient nitrogen concentration is 90–99.9%. Dichloroethylene may be added at 0–0.5% for a time that is dependent upon the desired thickness as would be appreciated by one of ordinary skill in the art. At the end of segment 230, an anneal in pure nitrogen may be carried out. In the illustrative sequence of FIG. 2, during segments 200–220 an oxide is grown having a thickness in the range of 5–10 Å. Segment 230 results in the growth of approximately 2.5–10 Å of oxide. Upon completion of segment 230, the growth of the first oxide portion 31 (in FIG. 4) is completed. Illustratively, this first oxide portion is grown at a temperature lower than the viscoelastic temperature of silicon dioxide ($T_{ve}$), which is approximately 925° C. The first oxide portion 31 may comprise 25–98% of the total thickness of the oxide layer 30. In an exemplary embodiment in which the oxide layer 30 has a thickness of 30 Å or less, the first oxide portion 31 has a thickness of approximately 7.5–20 Å. As discussed more fully herein, applicants theorize that the first oxide portion 31 acts as a sink for stress relaxation that occurs during the growth of second oxide portion 32 under first oxide portion 31.

Segment 240 is the first segment in the temperature increase to a temperature above the viscoelastic temperature of silicon dioxide. This ramp up in temperature occurs relatively slowly, at a rate of approximately 5–15° C. per minute and in a nearly pure, nitrogen ambient (the ambient concentration of oxygen in this segment is illustratively 0%–5%). The temperature reached at the end of segment 240 is approximately 50° C. below the high temperature oxide (HTO) growth temperature of segment 260. Segment 250 is a modulated heating segment in which the temperature is increased at a rate of approximately 5–10° C. per minute to a temperature above the viscoelastic temperature. In the illustrative embodiment the HTO growth temperature is in the range of 925–1100° C. The same flows/concentration of oxygen and nitrogen of segment 240 are used in segment 250. At the end of segment 250, the HTO growth temperature is reached.

Segments 240 and 250 are useful steps in the exemplary embodiment of the present invention. As was the case in the temperature ramp-up to segment 230 the (LTO growth segment) the careful ramp-up of temperature in segments 240 and 250 prevents overshooting the desired growth temperature, in this case the HTO growth temperature of the present invention. The rate of temperature increase at the illustrated low ambient oxygen concentration is useful in retarding oxide growth thereby preserving the oxide thickness budget. Finally, applicants believe that the careful heating in a low oxygen ambient in segments 240 and 250 reduces growth stress, and consequently a reduces the occurrence of oxide growth defects (e.g., slip dislocations and stacking faults).

Segment 260 is the HTO growth step, where the growth temperature is illustratively above the viscoelastic temperature of silicon dioxide. The temperature achieved at the end of segment 250 is maintained in the growth step in segment 260 in a 25% or less oxygen ambient for approximately 2 to 20 minutes so that an additional 2–12 Å of oxide may be grown at high temperature. The second portion may comprise on the order of 2–75% of the total thickness of the oxide layer 30. The final portion of segment 260 may include an anneal in pure nitrogen. Applicants believe (again without wishing to be bound to such a belief) that the high temperature growth above the viscoelastic temperature (approximately 925° C.) results in the growth of an oxide (second oxide portion 32) having certain properties.

Segment 270 of the exemplary embodiment of FIG. 2 is a cooling segment also referred to as a modulated cooling segment. A temperature ramp down is carried out at a rate of approximately 2–5° C. per minute to a temperature at the end of segment 270 which is below the viscoelastic temperature. For example, the temperature reached at the end of segment 270 is in the range of 900–800° C. Segment 270 is carried out in a nearly pure nitrogen ambient, which is inert. During the cooling of a grown oxide to below the viscoelastic temperature, stress may result in the oxide, particularly at the substrate-oxide interface. As a result of this stress, defects such as slip dislocations and oxidation induced stacking faults may be formed at energetically favored sites such as heterogenities and asperities. These defects may be viewed as routes for diffusional mass transport and leakage current paths which can have a deleterious impact on reliability and device performance. The modulated cooling segment, and the stress absorbing or stress sink characteristics of the first oxide portion 31 (particularly during the modulated cooling segment) results in a substantially stress free oxide-substrate interface. Moreover, the defect density is reduced. Finally, segment 280 represents a further ramp down at a faster rate on the order of approximately 35–65° C. per minute in an inert ambient such as pure nitrogen. Segment 290 is the boat pull at about 500° C. in a pure nitrogen ambient.

FIGS. 3–5 show the cross sectional view of the steps of forming the oxide 30. The substrate 22 is generally oxidizable, illustratively monocrystalline or polycrystalline silicon, or silicon islands in silicon on insulator (SOI) substrates. The first oxide portion 31 may be considered the low temperature oxide (LTO) portion, having been formed below approximately 925° C. In addition to providing a stress sink during the formation of the second oxide portion 32 the first oxide portion 31 enables oxide growth thereunder. As such, first oxide portion 31 must allow the diffusion of oxygen there through so that oxidation of the substrate 22 can occur, resulting in the second oxide portion 32. In the illustrative embodiment, the first portion is silicon dioxide.

However, other materials may be used in this capacity as well. Alternative materials include but are not limited to a lightly nitrided (for example 0.2 to 3% nitrogen by weight) silicon dioxide layer so that boron penetration is prevented, which is beneficial in the prevention of poly-depletion. Moreover, the first oxide portion 31 may be steam oxide or a grown-deposited composite oxide layer. The second oxide portion 32 may be considered the high temperature oxide (HTO) portion grown at a temperature above the viscoelastic temperature of 925° C. For purposes of illustration, the high temperature growth of the second portion 32 is in the range 925° C.

Characteristics of the oxide layer 30 of the present invention include improved interfacial planarity and a reduction in the stress both in the bulk of the oxide and at the interface between the oxide and the substrate. This becomes readily apparent from a comparison of the FIGS. 6 and 7.

Figure 6:
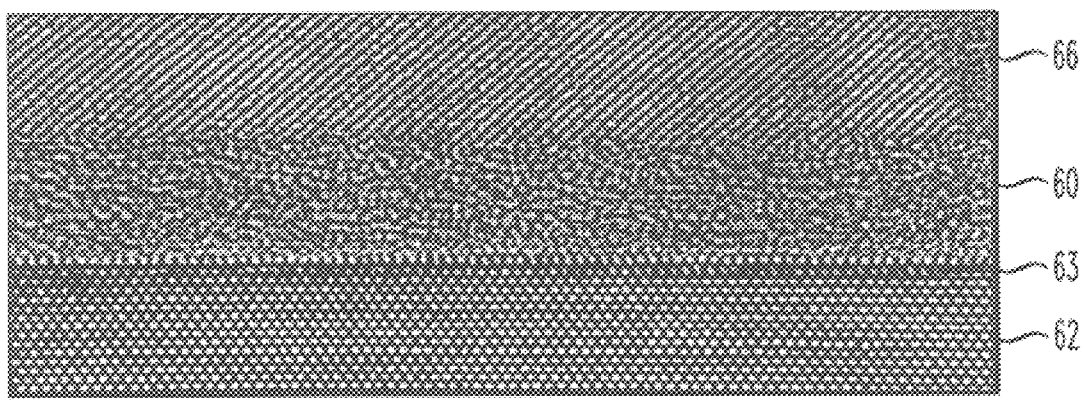
FIG. 6 is a transmission electron microscope (TEM) lattice image of a conventional oxide on a substrate having a conductive layer on the oxide.
Figure 7:
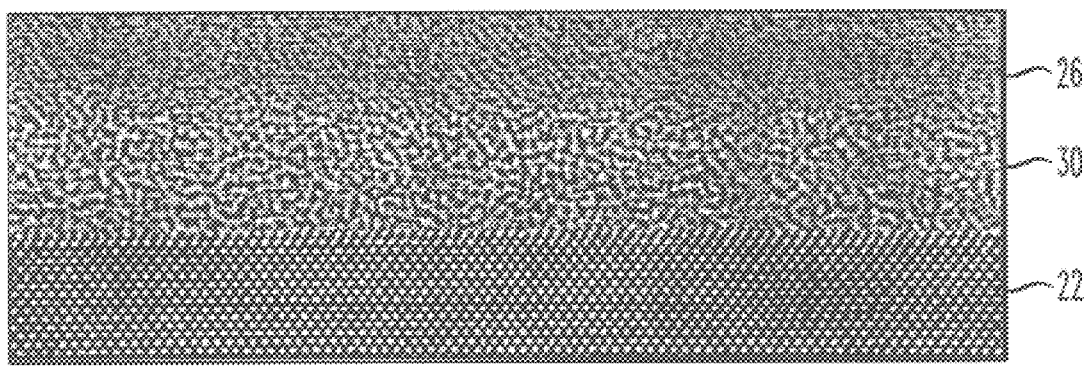
FIG. 7 is a transmission electron microscope (TEM) lattice image of an oxide layer on a substrate including a conductive layer on the oxide in accordance with an exemplary embodiment of the present invention.

FIG. 6 is a TEM lattice image of a MOS structure incorporating conventional oxide; FIG. 7 is a TEM lattice image a MOS structure incorporating the exemplary oxide of the present invention. FIG. 6 shows a substrate 62, a conventional oxide layer 60 and a conductive layer 66. In the image of FIG. 6, there is a stress band 63 (dark contrast) indicating the existence of a strain field between the oxide 60 and the substrate 62. In addition, the interface between the oxide 60 and the substrate 62 is relatively rough (i.e. not planar). Conventional oxides exhibit a surface roughness on the order of 5 Å or greater. Among other drawbacks, this degree of roughness can result in carrier scattering in the channel of an exemplary MOS transistor, resulting in reduced carrier mobility.

In contrast to the conventional oxide in FIG. 6, the interface between the graded grown oxide 30 and the substrate 22 in the exemplary embodiment of the present invention shown in FIG. 7 shows no dark contrast in the TEM image. Therefore, there is no noticeable stress band. Instead, the interface between the graded grown oxide 30 and the substrate 22 in the illustrative embodiment is substantially stress free. Moreover, the interface is substantially planar without any observable breakage in the Si (111) lines near the interface. Using standard stress measurement techniques such as x-ray micro-diffraction techniques, the silicon (400) Bragg peak profile indicates $2 \times 10^9$ dynes/cm$^2$ of compression by Warren-Averbach analysis. In contrast, conventional oxides exhibit $9 \times 10^{10}$ to $1 \times 10^{10}$ dynes/cm$^2$ of tension. Furthermore, although not discernable in the TEM of FIG. 7, the bulk oxide is substantially stress free having $0-2 \times 10^9$ dynes/cm$^2$ of compression measured by similar technique. Finally, the interface between the oxide 30 and the substrate 22 is substantially planar having a planarity that is not detectable within the resolution of conventional TEM imaging devices (approximately 3 Å).

As alluded to above, by virtue of the substantially stress free and planar Si—SiO$_2$ interface and the denser second oxide portion 32 formed by the present invention oxide of the present invention, there are improvements in the reliability of devices employing the oxide of the present invention. The device parameter drift during normal operation is often more significant than oxide breakdown when evaluating the reliability device employing the thin gate oxide. Device parameter drift can cause a device to fail the required parameter specifications long before an oxide breakdown event occurs. Drift in devices is dominated by two mechanisms. In a p-MOS device, bias- temperature (BT) drift is the dominant factor, while in an n-MOS device hot carrier degradation (also referred to as hot carrier aging (HCA)) dominates.

Figure 8:
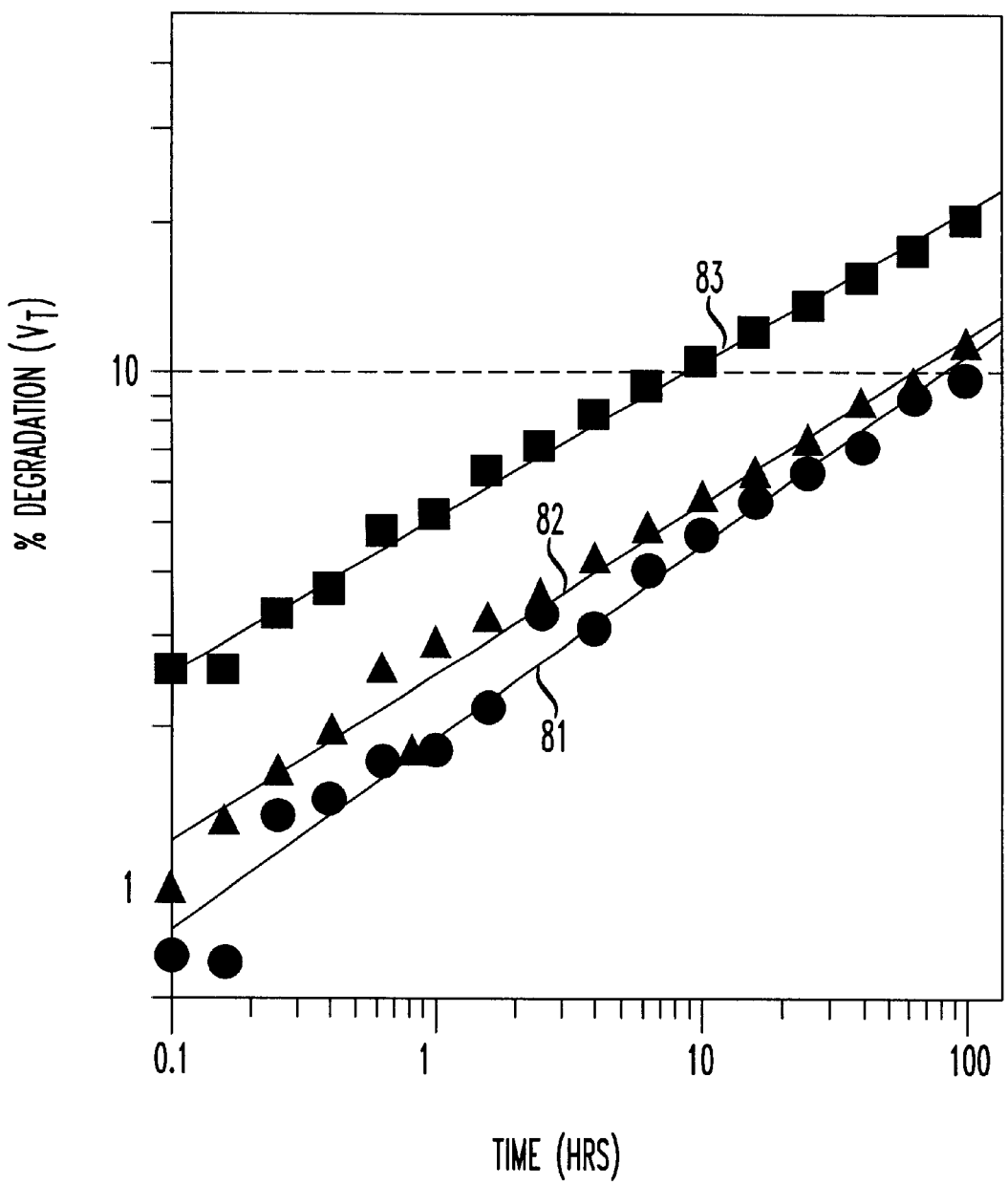
FIG. 8 is a graph of percent degradation of $V_T$ ($V_T$ drift) over time of illustrative oxides of the present invention and a conventional oxide.

The migration to surface channel devices for better off-state leakage performance can result in drift in the threshold voltage ($V_T$) under bias temperature (BT) conditions. This drift phenomenon is attributed to the creation of hot holes due to impact ionization by electrons which have tunneled into the silicon substrate. These hot holes are trapped within the oxide. It is theorized that the traps within the oxide are due to weak Si—O bonds in the bulk oxide which behave like hole traps. These trapped holes act as positive charge within the oxide resulting in shift in the threshold voltage ($V_T$). In contrast to conventional oxides, the second oxide portion 32 of the present invention is believed to have a reduced number of weak silicon-oxygen bonds. Accordingly, there is a reduced incidence of traps. Again, this follows from the substantially stress free, dense nature of the second oxide portion 32. The propensity for threshold voltage shift in the oxide of the present invention is significantly lower. This is shown in FIG. 8, where the percentage degradation of threshold voltage in two illustrative samples of the oxide of the present invention having thicknesses of 36 Å (plot 81) and 32 Å (plot 82) is compared to a conventional oxide having a thickness of 33 Å (plot 83). As is clear from FIG. 8, bias temperature (BT) drift is significantly lower in devices using the oxide of the present invention.

Another phenomenon that can adversely impact the reliability of a device is hot carrier aging (HCA). In sub-micron gate structures, hot carrier effects result from a increased lateral electric field in the reduced length channel. This causes inversion-layer charges to be accelerated (or heated) to an extent that they may cause a number of harmful device phenomena, commonly referred to as hot carrier effects. An important hot carrier effect from the standpoint of reliability in devices is the damage inflicted on the gate oxide and/or the silicon-silicon dioxide interface by hot carriers. Hot carrier aging is believed to be due to interface trap generation or the breaking of passivating dangling bonds. To this end, dangling bonds in the silicon-silicon dioxide interface are conventionally passivated in a hydrogen ambient, thereby reducing the number of interface traps. While this passivation technique has met with some success in conventional oxides, hot carriers can readily break silicon-hydrogen bonds, thereby re-establishing the previously passivated interface traps. The traps in the interface act as scattering centers, thereby reducing the mobility of carriers within the channel. As is known, the drive current, $I_{on}$ (or saturation current, $I_{dsat}$), and the transconductance $g_m$ are directly proportional to the mobility of the carriers in the channel. Accordingly, as the scattering centers become more abundant due to hot carrier effects, the mobility of carriers in the channel is reduced, and the drive current and transconductance are reduced. Thus, the number of interface traps can cause the device to degrade (age) due to drift in device parameters such as drive current and transconductance. This degradation has a deleterious impact on device reliability.

The oxide of the present invention has a reduced incidence of dangling silicon bonds, and thereby a reduced number of interface traps. Applicants theorize that this is a result of a more complete oxidation process and because the interface is substantially stress-free and planar. Moreover, since there are fewer interface traps in the oxide of the present invention, there are fewer traps passivated with hydrogen; and it is anticipated that there will be less device drift due to hydrogen release in devices which incorporate the oxide of the present invention.

Figure 9:
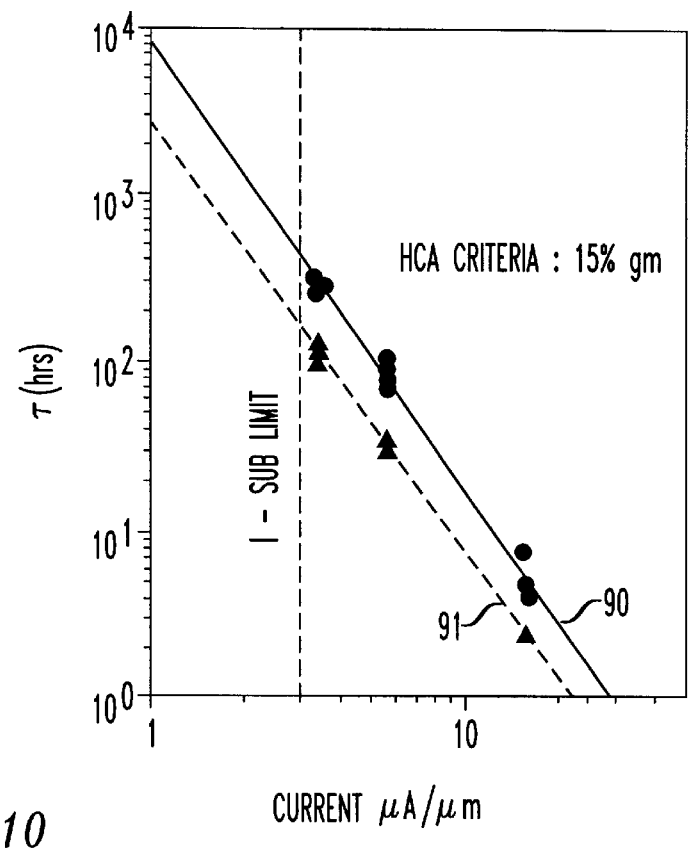
FIG. 9 is a graph including plots of time vs. substrate current ($I_{sub}$) indicative of hot carrier aging (HCA) for a conventional oxide and an oxide layer in accordance with an exemplary embodiment of the present invention.

Measured by standard technique, the interface trap density ($N_{it}$) of the oxide of the present invention is on the order of $3\times10^9$/cm to $5\times10^{10}$/cm$^2$ or less. The resulting improvement in hot carrier aging can be seen clearly in the graphical representation of FIG. 9. The hot carrier aging criteria by convention is a 15% change in transconductance. The plot labeled 90 is for a device incorporating a 32 Å oxide layer fabricated in accordance with the present invention. The plot labeled 91 is for a device incorporating for a conventional oxide of the same thickness. For example, the substrate current limit of 3 μA/μm is achieved at 120 hours in a conventional oxide in a MOSFET; in an exemplary oxide of the present invention this is limit achieved at 400 hours. As will be readily appreciated of those of ordinary skill in the art, hot carrier aging is improved by a factor of 3–10 by the oxide of the present invention when compared to conventional oxides.

The oxide of the present invention also results in an improvement in the time dependent dielectric breakdown (TDDB), another measure of reliability of the MOS device. This improvement in TDDB is believed to be a direct result of the stress free and high quality silicon-silicon dioxide interface of the present invention. As discussed above, due to the planar and substantially stress free interface between the substrate and oxide, the defect density $D_0$ is lower. As a result, it is believed that there are fewer defects, which can lead to diffusional mass transport and leakage current. Ultimately this can lead to an improvement in charge fluence or charge-to-breakdown($Q_{bd}$) and dielectric breakdown under temperature (for example>150° C. to 210° C.) and field acceleration (for example 3–6 MV/cm).

Figure 10:
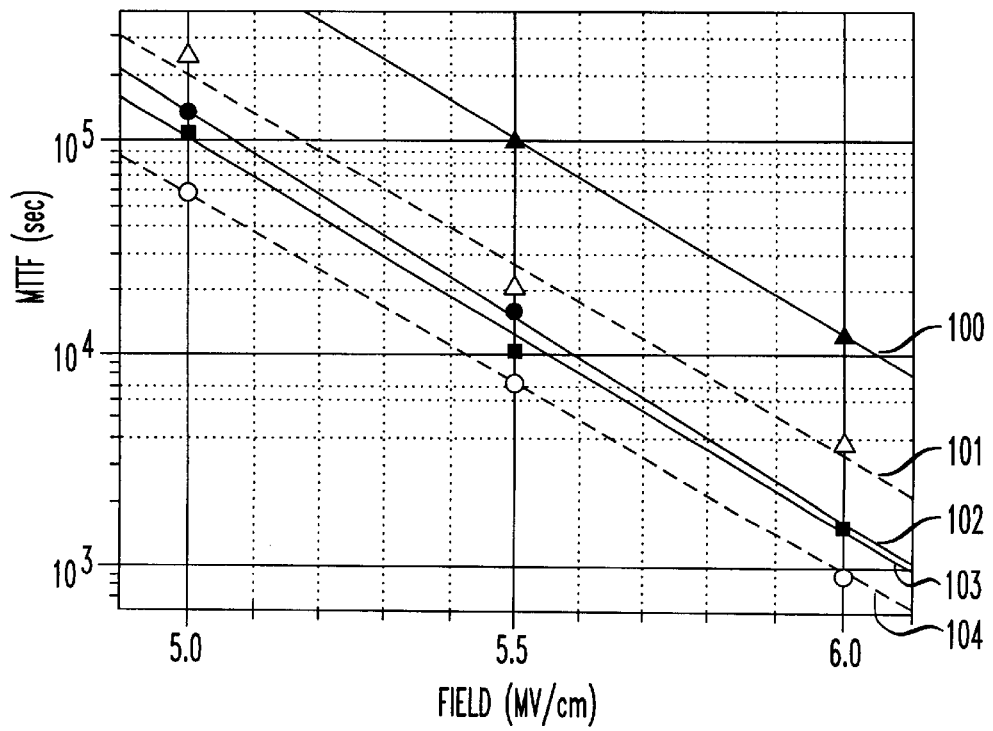
FIG. 10 is a graph including plots of mean time to failure (MTTF) vs. electric field for conventional oxide layers and oxide layers in accordance with an exemplary embodiment of the present invention.

As shown in FIG. 10 the oxide of the present invention results in a factor of 8–10 improvement of TDDB when compared to conventional oxides. In particular the mean time to failure (MTTF) vs. electric field strength is plotted for various conventional oxides and an exemplary oxide of the present invention in a 0.25 microns CMOS device. The plot 100 is for an illustrative oxide of the present invention having a thickness of 32 Å, while the corresponding conventional oxides of the same thickness are represented by plots 102 and 103. For purposes of illustration in an exemplary device, the oxide of the present invention exhibits a breakdown at 105 sec at a field of 5.5 MV/cm, compared to the conventional oxide which exhibits a breakdown at approximately $2\times10^4$ sec at the same electric field. Plot 101 is for an illustrative oxide of the present invention having a thickness of 28 Å, while that of plot 104 is for a 28 Å thick layer of conventional oxide. As can be seen, the illustrative oxide of the present invention exhibits a breakdown at about $2\times10^4$ sec for a 5.5 MV/cm electric field compared to a breakdown at $7\times10^3$ sec for the same electric field for a conventional oxide.

Figure 11:
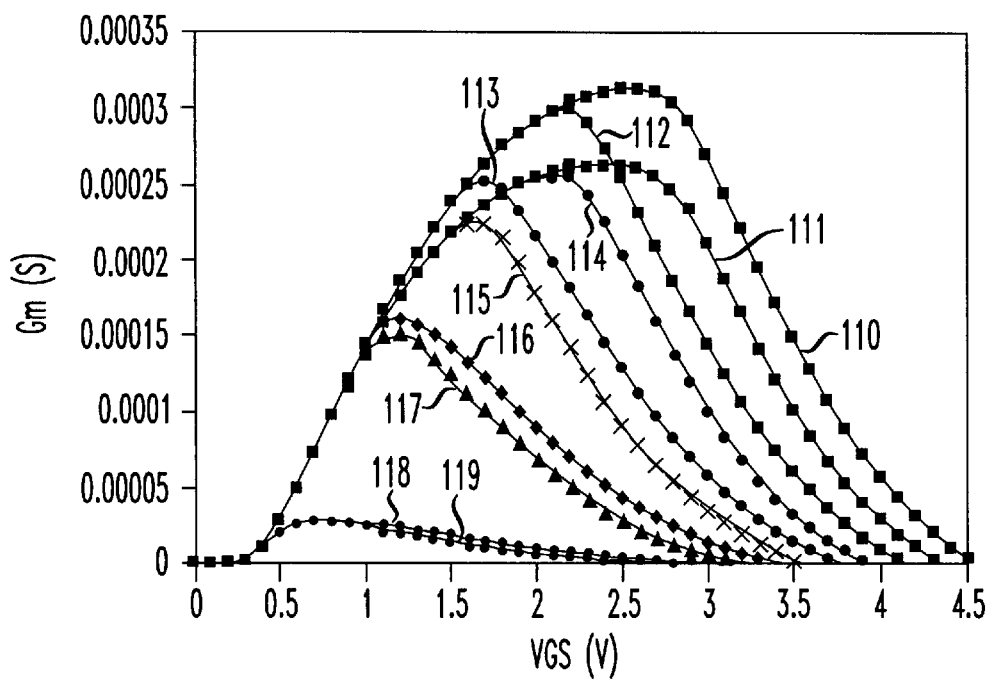
FIG. 11 is a comparative graph including plots of transconductance ($g_m$) vs. gate-source voltage ($V_{gs}$) for 15×15 82 m$^2$ NMOSFETs incorporating conventional gate oxide layers and those incorporating gate oxide layers in accordance with an exemplary embodiment of the present invention.

As stated previously, device performance is also improved by virtue of the oxide of the present invention. As discussed above, the carrier mobility within the channel can be significantly impacted by the number of traps and the degree of surface roughness (planarity) at the oxide-substrate interface. A more planar (less rough) interface and a reduction in the number of traps is manifest in an improvement in mobility. This results in an improvement in transconductance. This can be seen most readily from a review of FIG. 11. The even number plots 110, 112, 114, 116, 118, show the transconductance vs. gate-source voltage in an illustrative device using the oxide of the present invention. The odd number plots (111, 113, 115, 117 and 119) are plots of tranconductance vs. gate-source voltage in devices using conventional gate oxides. The tranconductance vs. gate-source voltage ($V_{gs}$) are plotted for a 15×15 μm$^2$ NMOSFET. Plots 110 and 111 are for a drain voltage of 2.1 volts. Plots 112 and 113 are for a drain voltage of 1.6 volts, while plots 114 and 115 are for a drain voltage of 1.1 volts. Plots 116 and 117 are for a drain voltage of 0.6 volts and plots 118 and 119 are for a drain voltage of 0.1 volt. As would be appreciated by one of ordinary skill in the art, FIG. 11 shows the oxide in accordance with exemplary embodiment of the present invention provides a 5–6% increase in channel mobility. This results in an improvement of drive current (saturation current $I_{d,sat}$) on the order of 20% in the illustrative embodiment.

Figure 12:
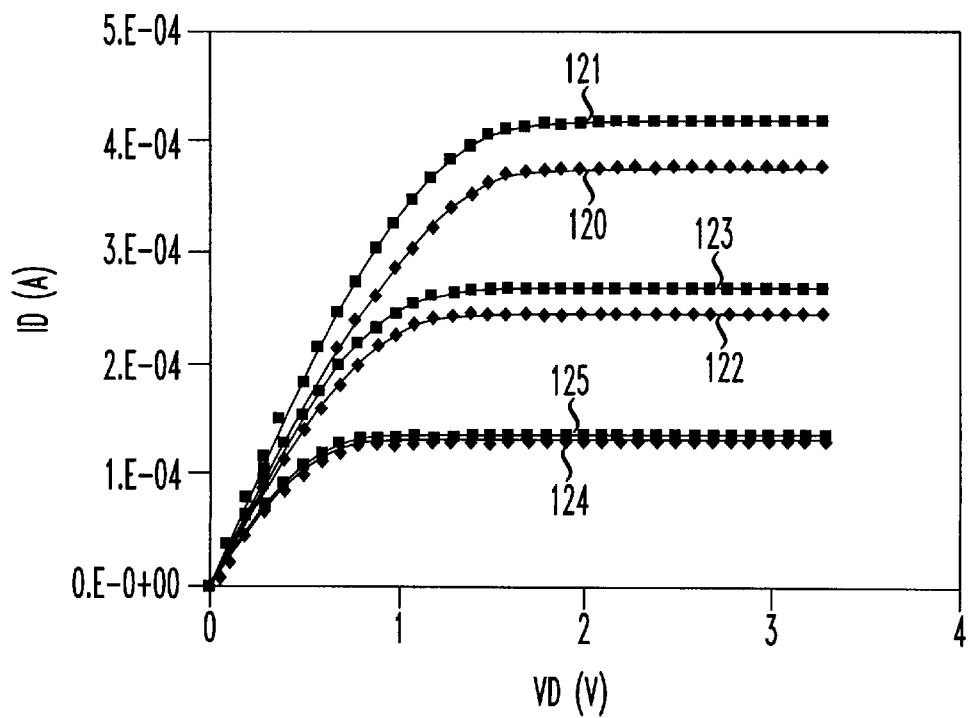
FIG. 12 is a comparative graph including plots of drain currents ($I_d$) vs. drain voltage ($V_d$) for a 15×15 $\mu m^2$ NMOSFETs incorporating conventional gate oxide layers and those incorporating gate oxide layers in accordance with an exemplary embodiment of the present invention.

Turning to FIG. 12, a comparative result of the oxide of the present invention and conventional oxides for a drive current for a 15×15 μm$^2$ NMOSFET is shown. The drain current is plotted vs. drain voltage for a series of gate voltages. Plots 120 and 121 are for gate voltages of 2.5 volts for the oxide layer of the present invention and a conventional oxide, respectively. Plots 122 and 123 are for a gate voltage of 0.2 voltages for the oxide of the present invention and a conventional oxide, respectively. Finally, plots 124 and 125 are for a gate voltage of 1.5 volts for the oxide of the present invention and a conventional oxide, respectively. As can be appreciated by one having ordinary skill in the art, devices incorporating the oxide of the present invention show improved sub-threshold and saturation characteristics compared to devices using conventional oxides.

Leakage current characteristics for a transistor employing the oxide of the present invention are also improved. As discussed above, leakage current is believed to be attributable to oxide defects ($D_0$). The oxide of the present invention has a defect density of 0.1 defects/cm$^2$ or less. Again, for thin gate dielectrics, the major contributors to $D_0$ are the growth induced defect density and the intrinsic stress within the oxide layer. The defects are formed at energetically favored sites such as heterogenities and asperities. These defects tend to grow outwardly as oxidation consumes silicon around the defect and eventually a network of defects may exist. These defects may be viewed as pipes for diffusional mass transport as well as potential leakage current paths, which can have a significant impact on device reliability and performance.

Figure 13:
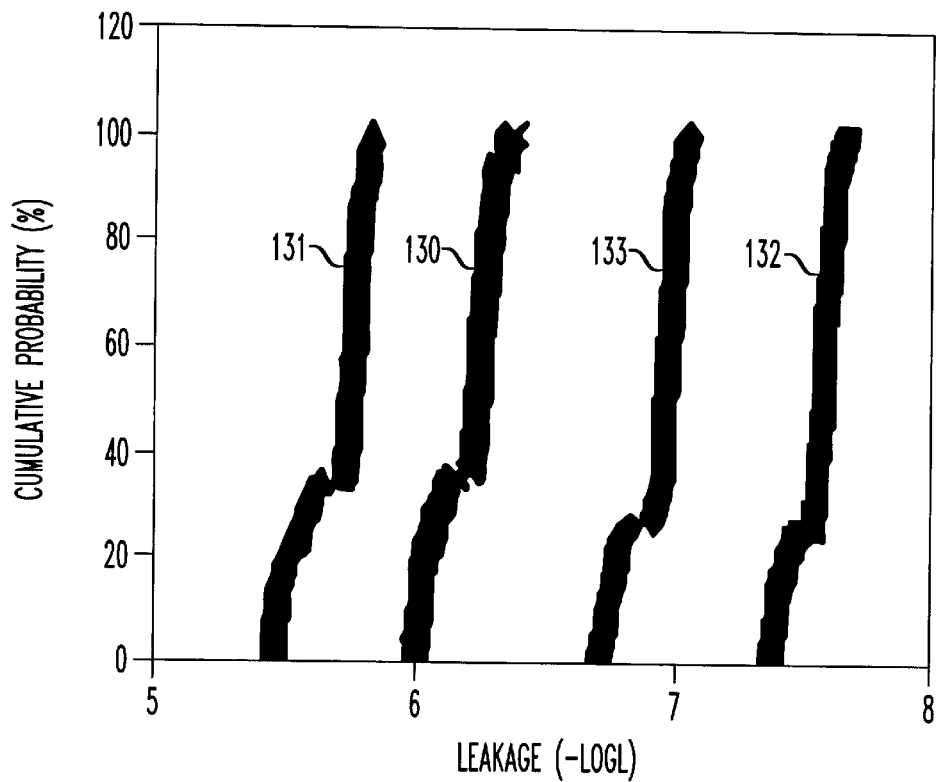
FIG. 13 is a comparative graph including plots of cumulative probability vs. leakage for 15×15 $\mu m_2$ FETS in a n-type tub including conventional gate oxide layers and gate oxide layers in accordance with an exemplary embodiment of the present invention.

FIG. 13 is a graph of cumulative probability vs. leakage current for gate oxides in an n-type tub at a voltage 2.0 volts. Plot 130 is for a gate oxide layer in accordance with the present invention having a thickness of 28 Å, while plot 131 is for a conventional oxide of the same thickness. Plot 132 is for an oxide layer of the invention of the present disclosure having a thickness of 32 Å, while plot 133 is for a conventional oxide having a thickness of 32 Å.

Figure 14:
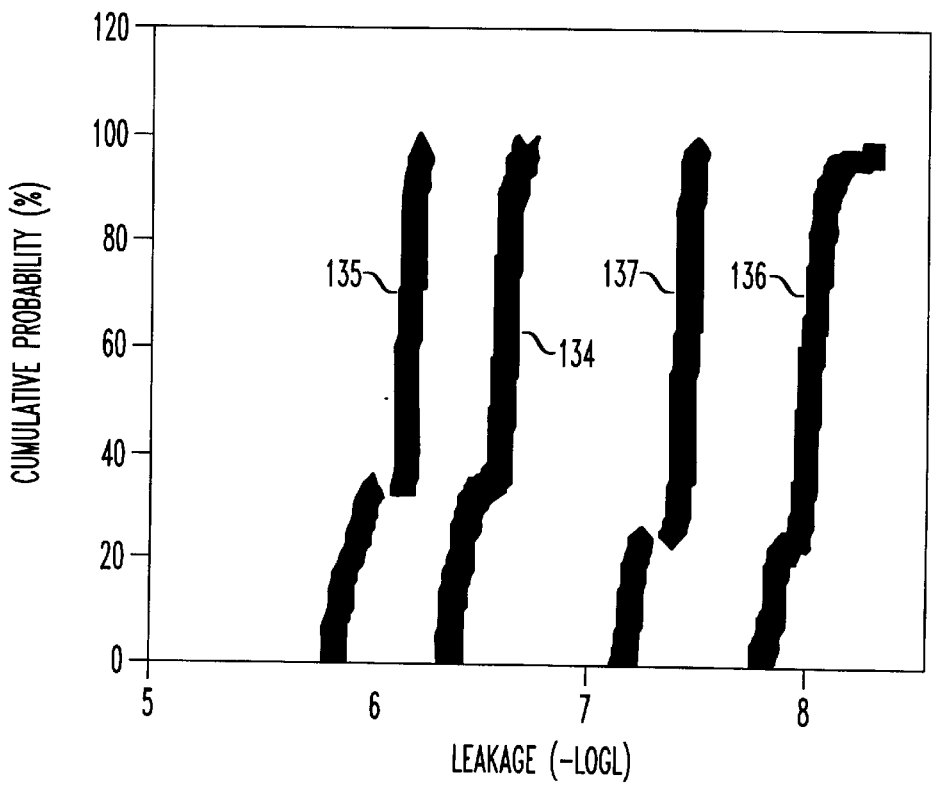
FIG. 14 is a comparative graph including plots of cumulative probability vs. leakage for 15×15 $\mu m_2$ FETS in a p-type tub including conventional gate oxide layers and gate oxide layers in accordance with an exemplary embodiment of the present invention.

FIG. 14 presents various leakage plots for a p-type tub at a voltage of 2.0 volts. Plot 134 is for a gate oxide in accordance with the present invention having a thickness of 28 Å, and plot 135 is for a conventional oxide of the same thickness. Plot 136 is for an oxide of invention of the present disclosure having a thickness of 32 Å, while plot 137 is for a conventional oxide layer having a thickness of 32 Å. From FIGS. 13 and 14 it can be appreciated that the oxide of the present invention offers a 8–10 times improvement leakage current. Moreover, with this significant improvement in leakage current, as one of ordinary skill in the art would readily appreciate, the charge control over the channel is improved, with improved sub-threshold characteristics ($I_{off}$).

The invention having been described in detail, it is clear that variations and modifications will be apparent to one of ordinary skill in the art. Such modifications and related embodiments of the disclosed invention are included with the scope of the appended claims.

What is claimed:

1. A process for fabricating an oxide, the process comprising:

(a) exposing said substrate to a first oxidizing ambient, wherein exposing said substrate to a first oxidizing ambient includes increasing from an initial temperature to a first temperature below a threshold temperature at a first ramp rate, increasing from said first temperature to a second temperature below said threshold temperature at a second ramp rate, and growing at least a portion of said oxide;

(b) exposing said substrate to a second oxidizing ambient, wherein exposing said substrate to a second oxidizing ambient includes increasing from said second temperature to a third temperature at a third ramp rate, and increasing from said third temperature to a temperature above said threshold temperature at a fourth ramp rate; and (c) cooling said substrate to a temperature below said threshold temperature, wherein said oxide has a thickness of 15 Å or less.

2. A process as recited in claim 1, wherein said first temperature below said threshold temperature is in the range of 750° C. to 850° C. and said first ramp rate is approximately 50° C.–125° C. per minute.

3. A process as recited in claim 1, wherein said second temperature below said threshold temperature is approximately 800° C.–900° C. and said second ramp rate is approximately 10° C.–25° C. per minute.

4. A process as recited in claim 1, wherein said substrate is oxidizable silicon and said threshold temperature is the viscoelastic temperature of silicon dioxide.

5. A process as recited in claim 1, wherein step (b) further comprises:

increasing from said second temperature to said third temperature at a ramp rate of approximately 5–15° C./minute in an ambient oxygen concentration of approximately 0%–5%;

increasing from said third temperature to said temperature above said threshold temperature at a ramp rate of 5–10°C./minute in an ambient oxygen concentration of approximately 0%–5%; and growing at least a portion of the oxide in an oxygen ambient concentration of about 25% or less.

6. A process as recited in claim 1, wherein step (c) further comprises:

reducing from said temperature above said threshold temperature to approximately 800° C. to 900° C. at a rate of about 2° C./min–5° C./min; and reducing said temperature of approximately 800° C. to 900° C. to a boat pull temperature at a rate of about 35° C./min–65° C./min, wherein said oxide portion formed in step (a) is a first oxide portion and acts as a stress sink to a second oxide portion formed in step (b) during at least a portion of said cooling.

7. A process as recited in claim 1, wherein said substrate is oxidizable.

8. A process as recited in claim 1, wherein said substrate is chosen from the group consisting essentially of monocrystalline silicon, polycrystalline silicon and silicon islands in a silicon on insulation (SOI) substrate.

9. A process as recited in claim 1, wherein said threshold temperature is the viscoelastic temperature of $SiO_2$.

10. A process as recited in claim 6, wherein said threshold temperature is the viscoelastic temperature of $SiO_2$.

* * * * *